United States Patent
Chou

[11] Patent Number: 6,015,641
[45] Date of Patent: Jan. 18, 2000

[54] REDUCTION OF OPTICAL PROXIMITY EFFECT OF BIT LINE PATTERN IN DRAM DEVICES

[75] Inventor: Yueh-Lin Chou, Taichung, Taiwan

[73] Assignee: Worldwide Semiconductor Manufacturing Corporation, Hsinchu, Taiwan

[21] Appl. No.: 09/111,683

[22] Filed: Jul. 8, 1998

[51] Int. Cl.[7] ....................................... G03F 9/00
[52] U.S. Cl. ................................................ 430/5
[58] Field of Search ..................... 630/5, 22, 322, 630/311; 356/373

[56] References Cited

U.S. PATENT DOCUMENTS 5,585,210  12/1996  Lee et al. ................................. 430/5
5,783,336   7/1998  Aoki et al. ............................... 430/5

*Primary Examiner*—S. Rosasco
*Attorney, Agent, or Firm*—Blakely Sokoloff Taylor & Zafman

[57] ABSTRACT

A bitline mask pattern having reduced optical proximity effect for use in manufacturing a semiconductor memory device is disclosed. The bitline mask pattern comprises: a plurality of bitlines having a plurality of contact pads that are equally spaced apart. The bitlines are arranged parallel to each other in a columnar array and such that alternate bitlines have their contact pads aligned with each other. The contact pads having a rectangular shape, but at each corner of the contact pad, rectangular corner portions removed, and at opposing sides of the contact pads, rectangular side portions are removed.

12 Claims, 4 Drawing Sheets

REDUCTION OF OPTICAL PROXIMITY EFFECT OF BIT LINE PATTERN IN DRAM DEVICES

FIELD OF THE INVENTION

The present invention relates to the correction of optical proximity effect (OPE) in photolithography, and more particularly, to a new bit line pattern suitable for use in DRAM devices that reduces OPE.

BACKGROUND OF THE INVENTION

As DRAMs become more highly integrated, the spacing between individual memory cells decreases. This causes many design and engineering challenges, not the least of which is in photolithography. In a photolithography process, a resist is coated on a wafer and then exposed to light via a reticle having a pattern formed on a surface of the photomask. The resist is then developed. Thus, a pattern corresponding to the pattern on the reticle is formed in the resist.

An integral component of a photolithographic apparatus is the reticle which includes the pattern corresponding to features at one layer in an IC design. The reticle typically includes a transparent quartz plate covered with a patterned light-blocking material such as chromium. The reticle is placed between a radiation source producing radiation of a pre-selected wavelength and a focusing lens which may form part of a "stepper" apparatus. Placed beneath the stepper is a resist covered silicon wafer. When the radiation from the radiation source is directed onto the reticle, light passes through the quartz (regions not having chromium patterns) and projects onto the resist covered silicon wafer. In this manner, an image of the reticle is transferred to the resist.

However, as the wavelength of light becomes large relative to the dimensions of the feature sizes on the reticle, the light passing through the reticle becomes refracted and scattered by the chromium edges. This causes the projected image to exhibit some rounding or other optical distortion. While such effects pose relatively little difficulty in layouts with large feature sizes (for example, layouts with critical dimensions above about 1 micron), they cannot be ignored in layouts having features smaller than about 1 micron. The problems become especially pronounced in IC designs having feature sizes near the wavelength of light used in the photolithographic process. The distortion caused by the refraction, diffraction, and scattering is referred to generally as the optical proximity effect (OPE). Unfortunately, any distorted illumination pattern propagates to a developed resist pattern and ultimately to IC features such as the bit line and other interconnects. As a result, the IC performance is degraded or the IC becomes unusable.

To remedy this problem, a reticle correction technique known as optical proximity correction (OPC) has been developed. OPC involves adding dark regions from a reticle design at locations chosen to overcome the distorting effects of diffraction and scattering. Another known technique to diminish the optical proximity effect is to employ a phase-shifting mask. Another technique is to employ deformation illumination such as oblique illumination.

Although these known techniques can reduce the optical proximity effect thereby improving the pattern transfer characteristics, in practice however, in the phase-shifting mask technique in which the phase of the exposure light is controlled and also in the deformation illumination technique in which the order of diffraction of the exposure light is controlled, these techniques are difficult to implement or still do not provide the necessary correction to the optical proximity effect.

In the DRAM manufacturing context, one of the necessary steps in manufacturing a DRAM is the masking and etching of repetitively patterned interconnects, such as the bit line. FIG. 1 shows a conventional reticle used to etch the bit line for a DRAM. As seen, via pads 101 are periodically placed in parallel interconnect lines 103. As the spacing between the parallel bit lines decreases, the optical proximity effect will tend to distort the bit line pattern.

What is needed is a new method for correcting for the optical proximity effect, particularly in a bit line mask used in the manufacture of DRAM devices.

SUMMARY OF THE INVENTION

A bitline mask pattern for use in manufacturing a semiconductor memory device is disclosed. The bitline mask pattern comprises: a plurality of bitlines, each of said bitlines including a plurality of contact pads that are equally spaced apart, said bitlines being arranged parallel to each other in a columnar array and such that alternate bitlines have their contact pads substantially aligned with each other, said contact pads having a rectangular shape, at each corner of said contact pad having rectangular corner portions removed, and with rectangular side portions removed from opposing sides of said contact pads.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
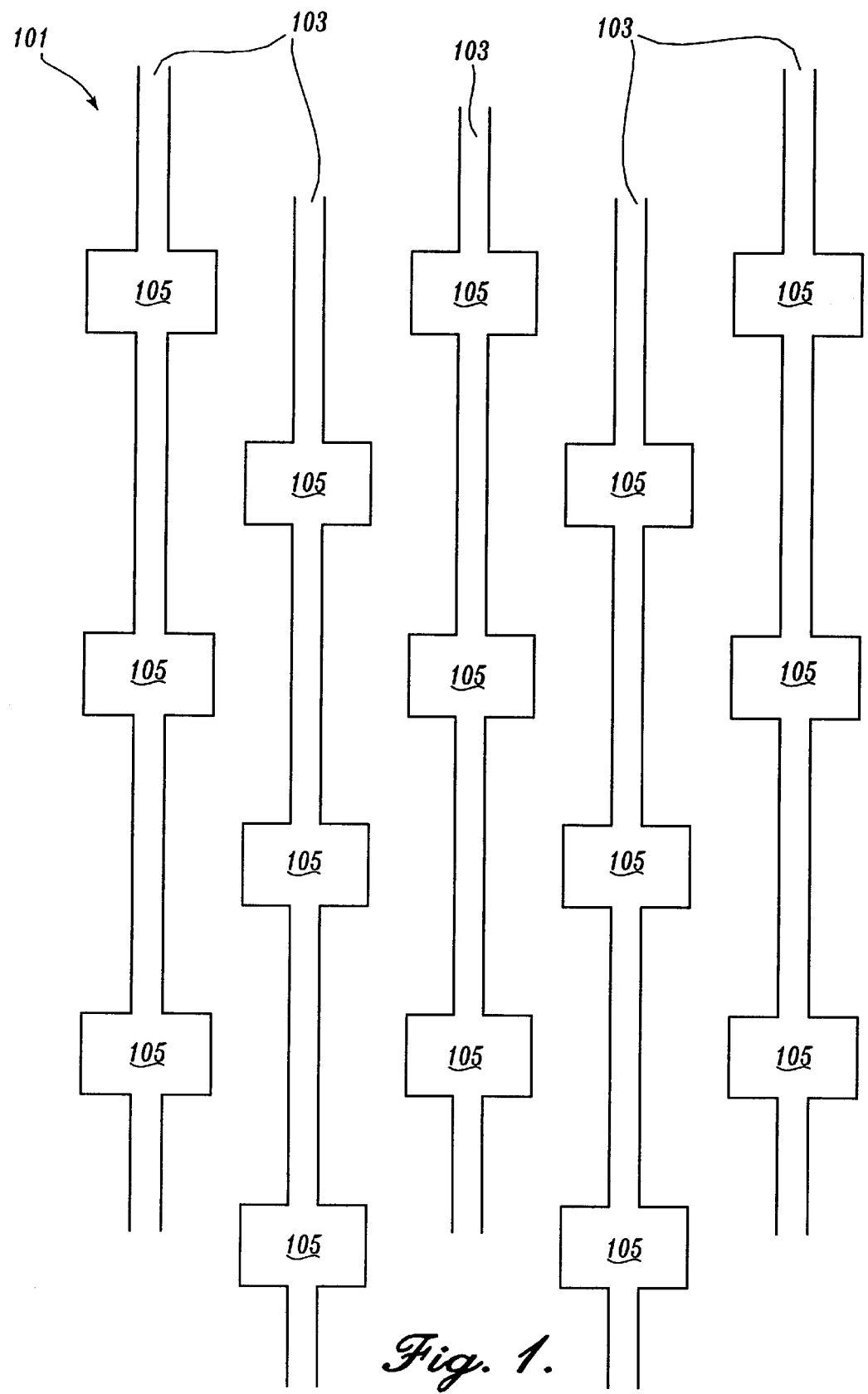
FIG. 1 shows a prior art bitline mask pattern for use in a DRAM semiconductor integrated circuit.

Turning to FIG. 1, a prior art bitline mask pattern 101 is shown. The bitline mask pattern 101 is the ideal designed pattern that will be formed into a reticle for use in a photolithography apparatus, such as a stepper machine. The bitline mask pattern 101 consists of a plurality of parallel bitlines 103. The parallel bitlines form a columnar array. Each of the bitlines 103 have periodically spaced between them contact pads 105. The contact pads 105 overlay the conductive contacts formed in an interlayer dielectric layer. The conductive contacts are in turn conductively connected to the underlying capacitor memory cells. As seen in FIG. 1, alternate bitlines 103 have their contact pads 105 aligned with each other. In such a manner, the contact pads 105 form a checkerboard pattern.

It has been found that the optical proximity effect for bitline mask patterns of the type shown in FIG. 1 generates significant deformation of the ideal pattern. As the density of DRAMs increases, the spacing between the bitlines 103 and contact pads 105 decreases.

Figure 2:
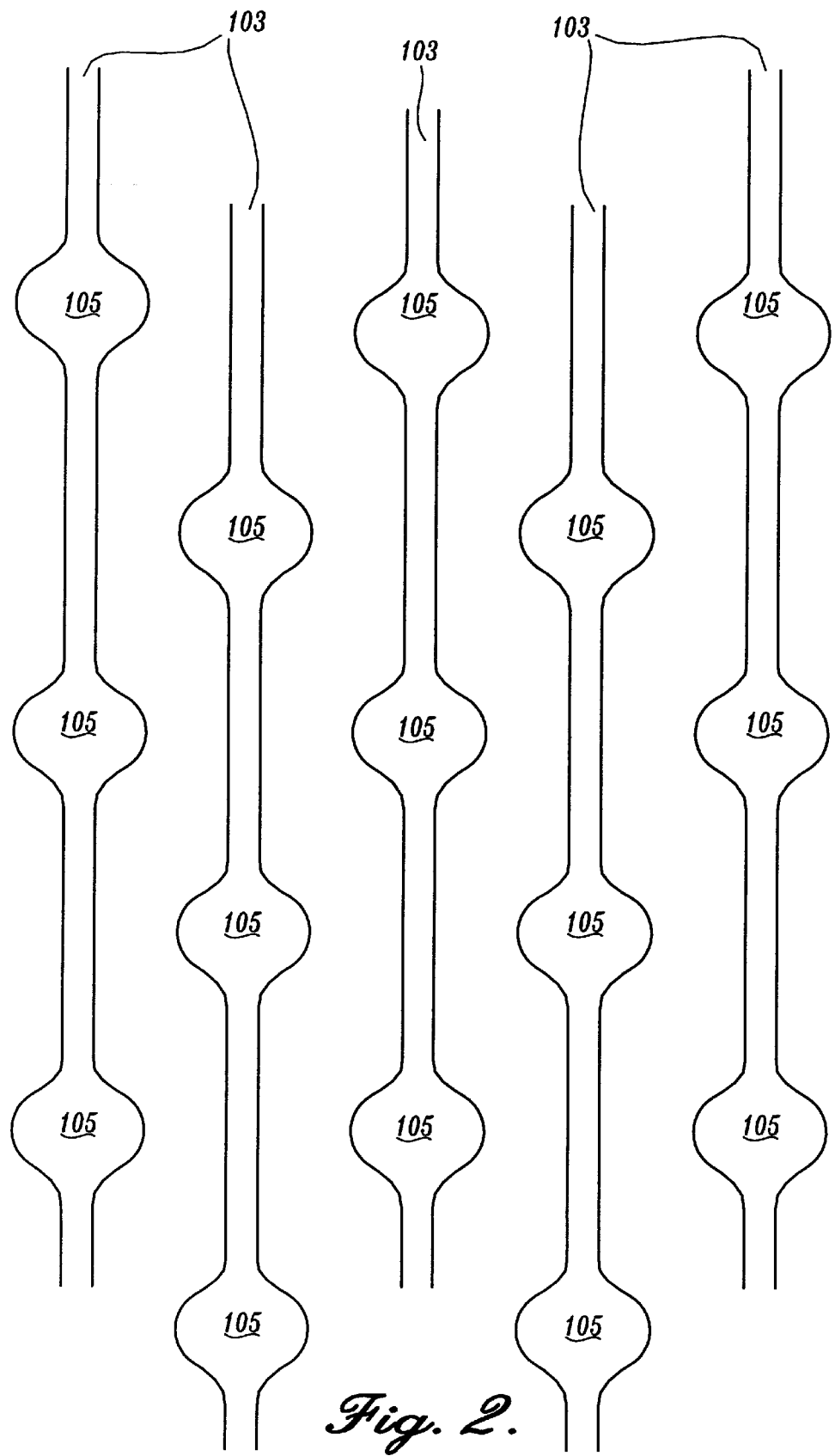
FIG. 2 shows a prior art bitline pattern showing the effects of optical proximity effect.

FIG. 2 shows the effect of the optical proximity effect on the bitline mask pattern that is transferred to the surface of the wafer. As seen, the sharp edges that define the contact pads 105 are rounded and "bulged". This is also referred to as the bridging effect. In certain instances, the bridging effect of the contact pads 105 extend to and contact with the adjacent bitlines. If left uncorrected, this phenomena may lead to catastrophic short circuits and memory failure.

It is believed that the bridging effect results from diffraction effects that occur when sharp corner or edge patterns are used (such as shown FIG. 1). In the photolithography process, a stepper lens has a predetermined numerical aperture. However, higher order diffraction orders are not able to be collected by the stepper lens. The result is that the recombined diffraction image is missing the original high frequency harmonics. This will result in the rounding of features and the bridging effect.

Figure 3:
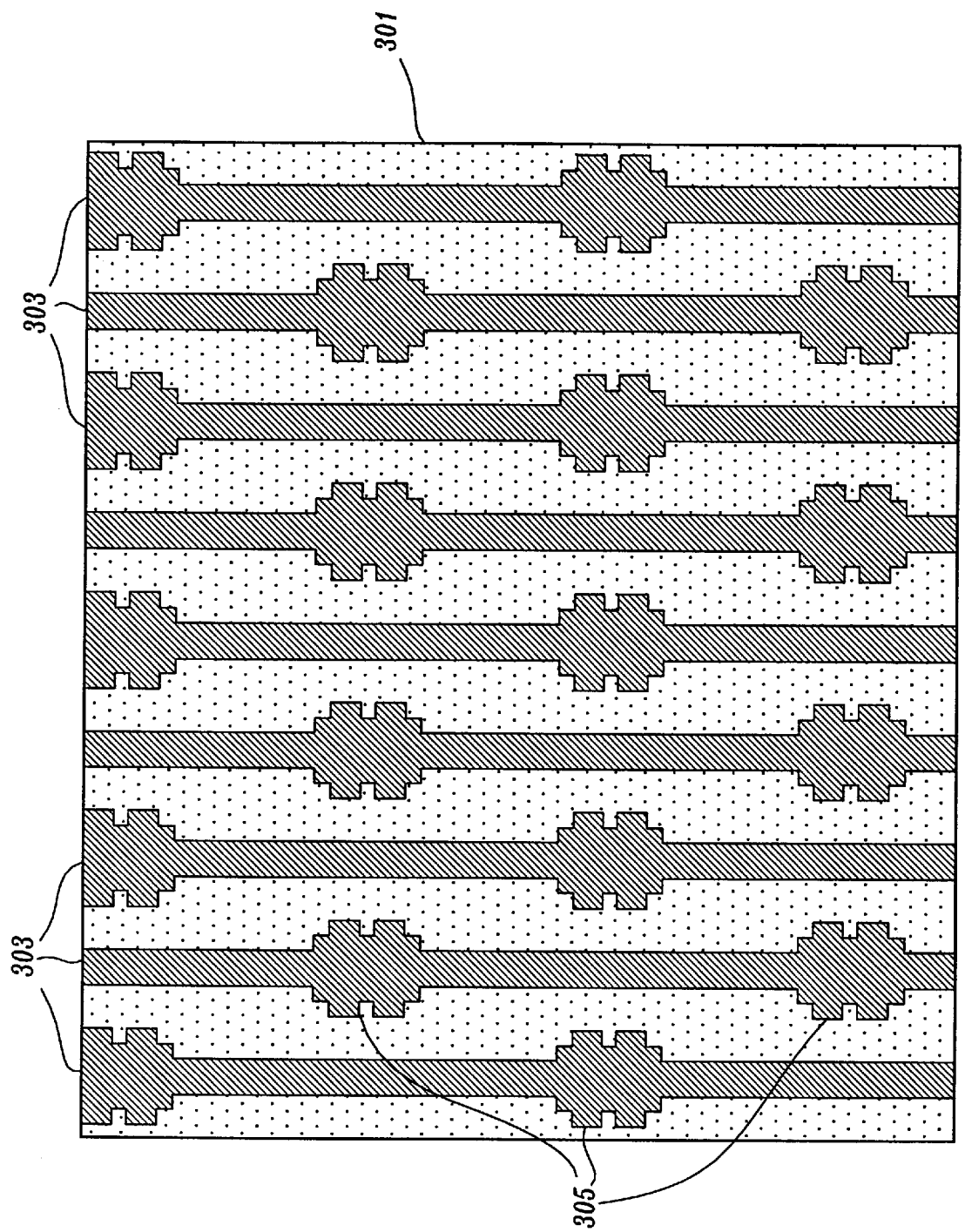
FIG. 3 shows a new bitline mask pattern in accordance with the present invention.

A new bitline mask pattern is disclosed in the present invention. Turning to FIG. 3, the bitline mask pattern 301 is shown. The macro-arrangement of the bitlines 303 is substantially the same as the prior art shown in FIG. 1. For example, a plurality of bitlines 303 are arranged parallel to each other in a columnar array. The bitlines 303 have a plurality of equally spaced apart contact pads 305. Alternate bitlines 303 have their contact pads 305 aligned horizontally with each other.

The primary difference between the bitline mask pattern 301 and the prior art is the precise composition of the contact pads 305. Whereas the prior art contact pads 105 are rectangular in shape, the contact pads 305 are rectangular in shape with portions removed.

Figure 4:
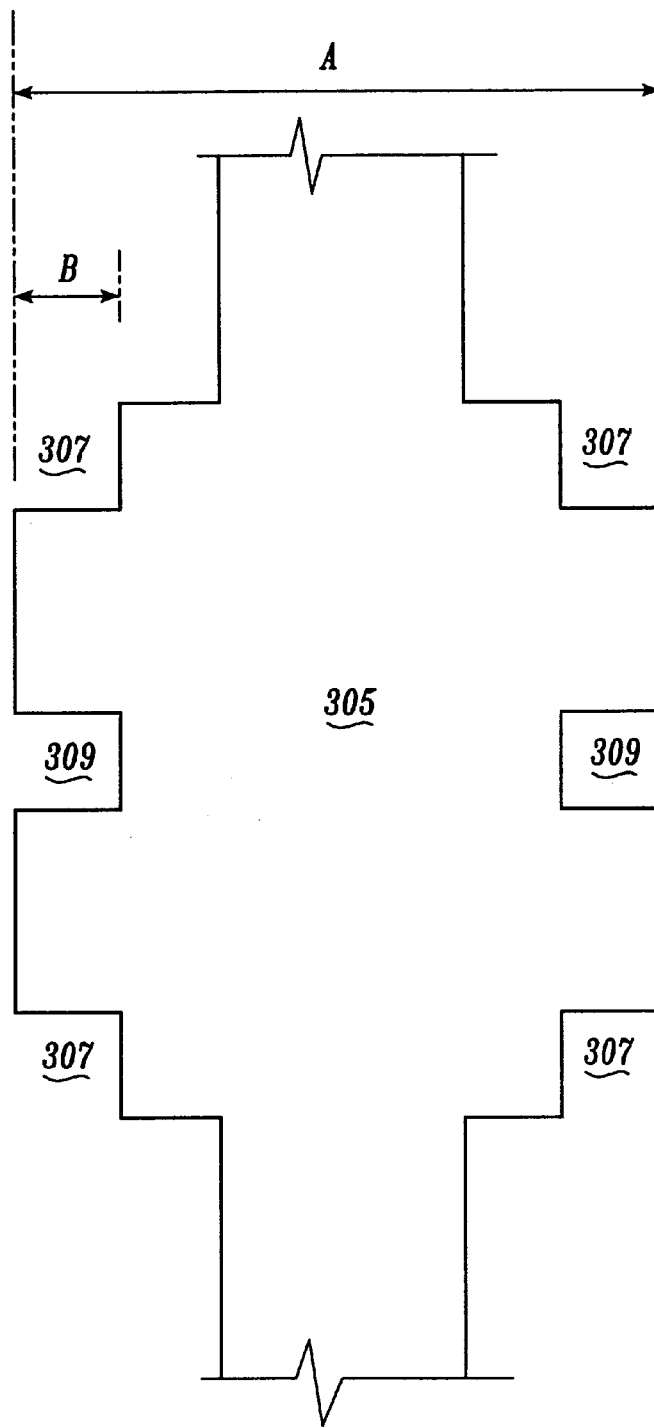
FIG. 4 shows a detail of the contact pads of the bitline mask pattern of FIG. 3.

Specifically, turning to FIG. 4, a contact pad 305 is shown enlarged. As seen, the contact pad 305 has rectangular corner portions 307 removed. The rectangular corner portions 307 are removed from each corner of the contact pad 305. Preferably, the contact pad 305 is square and has a contact pad dimension designated as "a". The rectangular corner portions 307 are also preferably square and have a corner portion dimension designated as "b". In the preferred embodiment, dimension "b" is between 10 and 20 percent of dimension "a", and more preferably approximately one-seventh of dimension "a".

Further, the contact pad 305 has rectangular side portions 309 removed. The rectangular side portions 309 are removed from the opposing sides of the contact pad 305 that are not in contact with the bitline. Preferably, the rectangular side portions 309 are square and have a dimension equivalent to that of the rectangular corner portions 307.

It has been found that the modification of the contact pads in accordance with FIG. 4 significantly reduces the optical proximity effect.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

I claim:

1. A bitline mask pattern for use in manufacturing a semiconductor memory device comprising:

a plurality of bitlines, each of said bitlines including a plurality of contact pads that are equally spaced apart, said bitlines being arranged parallel to each other in a columnar array and such that alternate bitlines have their contact pads substantially aligned with each other, said contact pads having a rectangular shape, at each corner of said contact pad having rectangular corner portions removed, and with rectangular side portions removed from opposing sides of said contact pads.

2. The pattern of claim 1 wherein each of said bitlines are separated by a predetermined distance that is less than a wavelength used to expose said semiconductor memory to transfer said bitline mask pattern.

3. The pattern of claim 1 wherein said contact pads are square and have a contact pad dimension and said rectangular corner portions are square and have a corner portion dimension between 10 and 20 percent of said contact pad dimension.

4. The pattern of claim 3 wherein said rectangular corner portion dimension is approximately one-seventh of said contact pad dimension.

5. The pattern of claim 3 wherein said rectangular side portions are square and have the same dimensions as said rectangular corner portions.

6. The pattern of claim 1 wherein said rectangular side portions are positioned to be in the center of said opposing sides.

7. The pattern of claim 5 wherein said rectangular side portions are positioned to be in the center of said opposing sides.

8. The pattern of claim 2 wherein said contact pads are square and have a contact pad dimension and said rectangular corner portions are square and have a corner portion dimension between 10 and 20 percent of said contact pad dimension.

9. The pattern of claim 6 wherein said rectangular corner portion dimension is approximately one-seventh of said contact pad dimension.

10. The pattern of claim 6 wherein said rectangular side portions are square and have the same dimensions as said rectangular corner portions.

11. The pattern of claim 2 wherein said rectangular side portions are positioned to be in the center of said opposing sides.

12. The pattern of claim 10 wherein said rectangular side portions are positioned to be in the center of said opposing sides.

* * * * *